United States Patent [19]
Park

[11] Patent Number: 5,898,624
[45] Date of Patent: Apr. 27, 1999

[54] NOISE RESTRAINING SEMICONDUCTOR MEMORY DEVICE

[75] Inventor: Chun-Seong Park, Cheongju, Rep. of Korea

[73] Assignee: LG Semicon Co., Ltd., Cheongju, Rep. of Korea

[21] Appl. No.: 08/969,466

[22] Filed: Nov. 13, 1997

[30] Foreign Application Priority Data

Dec. 16, 1996 [KR] Rep. of Korea ............... 96/66129

[51] Int. Cl.$^6$ .................................................. G11C 7/00
[52] U.S. Cl. ............................... 365/189.05; 365/191
[58] Field of Search ........................ 365/189.05, 191, 365/206, 190, 233, 230.08

[56] References Cited

U.S. PATENT DOCUMENTS

| | | | |
|---|---|---|---|
| 5,311,471 | 5/1994 | Matsumoto et al. | 365/189.05 |
| 5,444,666 | 8/1995 | Oh | 365/230.08 |
| 5,652,724 | 7/1997 | Manning | 365/189.05 |

*Primary Examiner*—Son Mai
*Attorney, Agent, or Firm*—Fleshner & Kim

[57] ABSTRACT

A noise restraining semiconductor memory device includes a memory cell array for outputting through a data line a complementary cell data signal selected in accordance with an input address signal, an output controller for combining a data output enable signal and a Y address latch signal and generating a data output control signal, and an output buffer for buffering and outputting to an input/output pin a data signal outputted from the memory cell array in accordance with the output control signal outputted from the output controller. The memory device makes an operation start time of the output buffer delayed later than a time point in which an output data signal of the memory cell is latched to an input terminal of the output buffer, thereby excluding ground noise.

9 Claims, 2 Drawing Sheets

FIG. 1
CONVENTIONAL ART
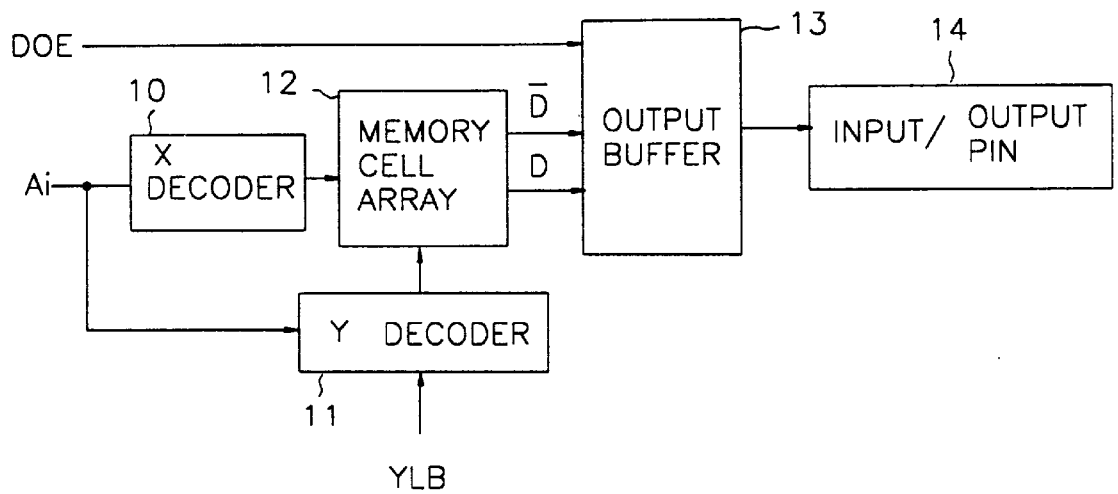
FIG. 2A
CONVENTIONAL ART
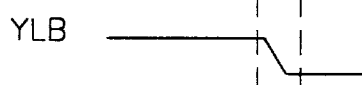
FIG. 2B
CONVENTIONAL ART
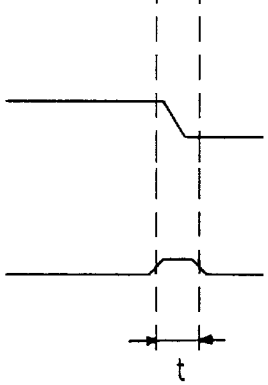
FIG. 2C
CONVENTIONAL ART

FIG. 4A    DOE

FIG. 4B    YLB

FIG. 4C    DOE'

FIG. 4D    GROUND NOISE

5,898,624

NOISE RESTRAINING SEMICONDUCTOR MEMORY DEVICE

BACKGROUND OF THE INVENTION

1. Field of the Invention

The present invention relates to a semiconductor memory device, and more particularly to an improved semiconductor memory device capable of restraining noise generation when a cell data signal is applied to an output buffer.

2. Description of the Prior Art

As disclosed in U.S. Pat. No. 5,043,944, a conventional semiconductor memory device for improving an output characteristic as shown in FIG. 1 includes: an X decoder 10 for decoding a row address signal outputted from an X address buffer (not shown); a Y decoder 11 for decoding a column address signal outputted from a Y address buffer (not shown) in accordance with a Y address latch signal YLB; a memory cell array 12 for outputting a cell data set $D_i/D$ in accordance with respective address signals decoded in the X decoder 10 and the Y decoder 11; and an output buffer 13 for buffering the output data of the memory cell array 12 in accordance with a data output enable signal DOE and applying the buffered output data to an input/output pin 14.

The operation of the thusly constituted conventional semiconductor memory device will now be described.

As shown in FIGS. 2A and 2B, when an output enable signal is externally enabled, a DRAM controller circuit (not shown) generates a data output enable signal DOE for controlling output buffer 13, and a Y address latch signal YLB for controlling an output of memory cell array 12.

The X decoder 10 decodes a row address signal outputted from an X address buffer (not shown) and outputs the decoded signal to a row decoder (not shown), which decodes an input signal and designates a row address in the memory cell array 12.

The Y decoder 11 decodes a column address signal outputted from a Y address buffer (not shown) and outputs the decoded signal to a column decoder (not shown) in accordance with Y address latch signal YLB. The column decoder decodes an input signal and designates a column address in the memory cell array 12.

The memory cell array 12 records data in memory cells designated by an address signal or reads data stored in the memory cells in accordance with the row address signal and the column address signal, respectively. In accordance with data output enable signal DOE, the output buffer 13 buffers and applies to the input/output pin 14 a cell data set $D_i/D$ outputted from the memory cell array 12.

Here, Y address latch signal YLB is enabled after data output enable signal DOE is enabled, so that as shown in FIG. 2A, the turning of Y address latch signal YLB to a low level denotes that the cell data set $D_i/D$ outputted from the memory cell array 12 are applied to an input terminal of the output buffer 13.

However, because the cell data set $D_i/D$ are instantly applied to the output buffer 13 at a time t when the Y address latch signal YLB is turned to a low level, as shown in FIG. 2C there occurs a ground noise.

SUMMARY OF THE INVENTION

Accordingly, it is an object of the present invention to provide a noise restraining semiconductor memory device for improving a noise characteristic of an output buffer by making an operation start time of the output buffer be delayed so as to be later than an input time of a cell data being applied to the output buffer.

To achieve the above-described object, there is provided a noise restraining semiconductor memory device which includes a memory cell array for outputting through a data line, a complementary cell data signals selected in accordance with an input address signal, an output controller for combining a data output enable signal and a Y address latch signal and generating a data output control signal, and an output buffer for buffering and outputting to an input/output pin the cell data signal outputted from the memory cell array in accordance with the output control signal outputted from the output controller.

BRIEF DESCRIPTION OF THE DRAWINGS

FIG. 1 is a block diagram of a conventional semiconductor memory device;

FIGS. 2A through 2C are timing views of respective signals in the circuit of FIG. 1;

FIGS. 4A through 4D are timing views of respective signals in the circuit of FIG. 3.

DETAILED DESCRIPTION OF THE INVENTION

Figure 3:
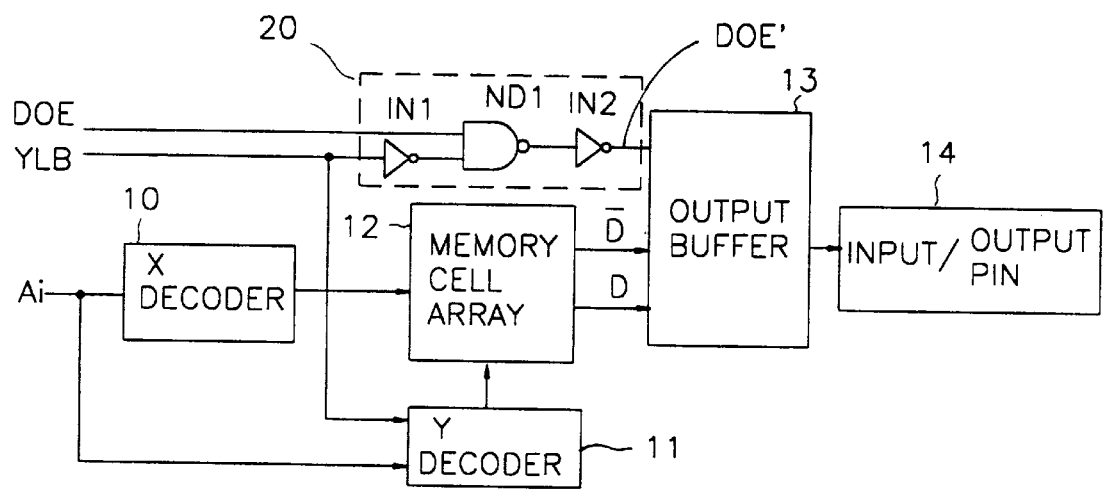
FIG. 3 is a block diagram of a noise restraining semiconductor memory device according to the present invention.
Figure 3:
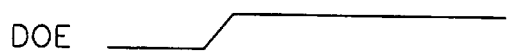
Figure 3:
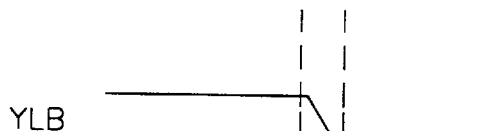
Figure 3:
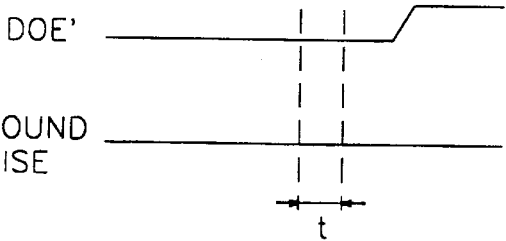

As shown in FIG. 3, the semiconductor memory device according to the present invention basically includes the conventional memory device as shown in FIG. 1, and further includes an output controller 20 for combining the data output enable signal DOE and the Y address latch signal YLB and outputting a data output control signal DOE' to output buffer 13.

The output controller 20 includes an inverter IN1 for delaying Y address latch signal YLB, a NAND gate ND1 for NANDing an output value of the inverter IN1 and data output enable signal DOE, and another inverter IN2 for inverting an output value of NAND gate ND1 and outputting data output control signal DOE' delayed by the inverter IN2.

The operation and effects of the thusly constituted memory device according to the present invention will now be described.

As shown in FIGS. 4A and 4B, the output enable signal is enabled in a DRAM circuit (not shown), which generates the data output enable signal DOE and the Y address latch signal YLB.

The X decoder 10 decodes a row address signal outputted from an X address buffer (not shown) and designates a row address in the memory cell array 12.

The Y decoder 11 decodes a column address signal outputted from a Y address buffer (not shown) in accordance with Y address latch signal YLB and designates a column address in the memory cell array 12.

The memory cell array 12 applies data set $D_i/D$ recorded in a memory cell designated by an inputted address signal Ai in accordance with the row address signal and the column address signal. The output controller 20 combines data output enable signal DOE and Y address latch signal YLB and outputs data output control signal DOE' to the output buffer 13.

The output buffer 13 buffers and applies to the input/output pin 14 a cell data set $D_i/D$ outputted from the memory cell array 12, in accordance with data output enable signal DOE' outputted from the output controller 20.

That is, the inverter IN1 in the output controller 20 delays the Y address latch signal YLB, and NAND gate ND1 NANDs data output enable signal DOE and an output value of the inverter IN1, so that data output control signal DOE' as shown in FIG. 4C is outputted through inverter IN2.

Here, no matter what conditions the data output enable signal DOE is subject to, the data output control signal DOE' maintains a disabled state in the case in which Y address latch signal YLB remains at a high level.

Consequently, in the semiconductor memory device according to the present invention, when Y address latch signal YLB is turned to a low level and the cell data set $D_i/D$ outputted from the memory cell array 12 are applied to input terminals of the buffer 13, the data output control signal DOE' remains at a high level, so that at a time t when Y address latch signal YLB is turned to a low level as shown in FIG. 4D, an input of the cell data set $D_i/D$ to the output buffer 13 does not incur noise. Further, besides Y address latch signal YLB, a data latch signal also can be applicable to the present invention.

As described above, the semiconductor memory device according to the present invention makes an operation start time of the output buffer be delayed to be later than a time point in which an output data signal of the memory cell is latched to input terminals of the output buffer, thereby excluding ground noise (ground floating).

What is claimed is:

1. A semiconductor memory device, comprising:

a memory cell array that outputs a complementary cell data signal selected in accordance with an input address signal;

an output controller that combines a data output enable signal and an address latch signal and generates a data output control signal; and an output buffer that buffers and outputs to an input/output pin the complementary cell data signal received from the memory cell array in accordance with the data output control signal outputted from the output controller, wherein the data output control signal and the address latch signal are generated at different times to prevent noise from being generated during the output of the complementary cell data signal.

2. The memory device of claim 1, wherein the output controller comprises:

a first logic gate that logically processes the address latch signal;

a second logic gate that logically processes an output value of the first logic gate and the data output enable signal; and a third logic gate that logically processes an output value of the second logic gate and outputs the data output control signal.

3. The memory device of claim 2, wherein in the output controller, when a high level address latch signal is applied, a low level output control signal is outputted irrespective of the data output enable signal state, and when a low level address latch signal is applied, the output control signal is generated in accordance with the data output enable signal state.

4. The memory device of claim 3, wherein the address latch signal is a Y address latch signal.

5. The memory device of claim 3, wherein the address latch signal is enabled after the data output enable signal and the data output control signal is enabled according to the address latch signal.

6. The memory device of claim 2, wherein the first, second and third logic gates are a first inverter, a NAND gate and a second inverter, respectively.

7. The memory device of claim 1, wherein the address latch signal is generated after the data output enable signal.

8. The memory device of claim 7, wherein the data output control signal is generated after the address latch signal.

9. A semiconductor memory device, comprising:

memory cell array means for outputting a cell data signal selected in accordance with an input address signal;

output control means for combining a data output enable signal and a Y address latch signal and generating a data output control signal, wherein the Y address latch signal is enabled after the data output enable signal is enabled; and output buffer means for buffering and outputting to an input/output pin the cell data signal outputted from the memory cell array means in accordance with the data output control signal outputted from the output control means, wherein the data output control signal is generated using the Y address latch signal and enabled after the Y address latch signal to prevent noise from being generated during the output of the cell data signal.

* * * * *